US009783886B2

(12) United States Patent
Archard et al.

(10) Patent No.: US 9,783,886 B2
(45) Date of Patent: Oct. 10, 2017

(54) PE-CVD APPARATUS AND METHOD

(71) Applicant: SPTS Technologies Limited, Newport (GB)

(72) Inventors: Daniel T Archard, Rhonda Cynon Taf (GB); Stephen R Burgess, Gwent (GB); Mark I Carruthers, Newport (GB); Andrew Price, Cardiff (GB); Keith E Buchanan, Monmouthshire (GB); Katherine Crook, Newport (GB)

(73) Assignee: SPTS TECHNOLOGIES LIMITED, Newport (GB)

( * ) Notice: Subject to any disclaimer, the term of this patent is extended or adjusted under 35 U.S.C. 154(b) by 0 days.

(21) Appl. No.: 15/064,631

(22) Filed: Mar. 9, 2016

(65) Prior Publication Data
US 2016/0265108 A1   Sep. 15, 2016

(30) Foreign Application Priority Data

Mar. 12, 2015  (GB) .................................. 1504202.1

(51) Int. Cl.
C23C 16/455 (2006.01)
H01J 37/32 (2006.01)
C23C 16/513 (2006.01)

(52) U.S. Cl.
CPC .......... *C23C 16/455* (2013.01); *C23C 16/513* (2013.01); *H01J 37/32633* (2013.01); *H01J 37/32834* (2013.01)

(58) Field of Classification Search
None
See application file for complete search history.

(56) References Cited

U.S. PATENT DOCUMENTS

| 5,558,717 | A | * | 9/1996 | Zhao | ................... C23C 16/4401 118/715 |
|---|---|---|---|---|---|
| 5,855,681 | A | | 1/1999 | Maydan et al. | |
| 6,051,286 | A | | 4/2000 | Zhao et al. | |
| 8,778,813 | B2 | | 7/2014 | Sankarakrishnan et al. | |
| 2001/0032591 | A1 | * | 10/2001 | Carducci | ............. C23C 16/4412 118/723 E |
| 2001/0044220 | A1 | * | 11/2001 | Sun | ..................... H01L 21/3145 438/786 |

(Continued)

FOREIGN PATENT DOCUMENTS

EP   0855452 A1   7/1998

*Primary Examiner* — Joseph Miller, Jr.
(74) *Attorney, Agent, or Firm* — Volentine & Whitt, PLLC

(57) ABSTRACT

A plasma-enhanced chemical vapor deposition (PE-CVD) apparatus includes a chamber including a circumferential pumping channel, a substrate support disposed within the chamber, one or more gas inlets for introducing gas into the chamber, a plasma production device for producing a plasma in the chamber, and an upper and a lower element positioned in the chamber. The upper element is spaced apart from the substrate support to confine the plasma and to define a first circumferential pumping gap, and the upper element acts as a radially inward wall of the circumferential pumping channel. The upper and lower elements are radially spaced apart to define a second circumferential pumping gap which acts as an entrance to the circumferential pumping channel, in which the second circumferential pumping gap is wider than the first circumferential pumping gap.

13 Claims, 3 Drawing Sheets

(56) References Cited

U.S. PATENT DOCUMENTS

| | | |
|---|---|---|
| 2006/0019031 A1 | 1/2006 | Furuta et al. |
| 2007/0065597 A1 | 3/2007 | Kaido et al. |
| 2010/0291319 A1 | 11/2010 | Yamashita et al. |
| 2014/0262026 A1 | 9/2014 | Forster et al. |
| 2014/0326276 A1 | 11/2014 | Wu et al. |

* cited by examiner

PE-CVD APPARATUS AND METHOD

BACKGROUND

This invention relates to a plasma enhanced chemical vapour deposition (PE-CVD) apparatus and to a method of performing PE-CVD.

PE-CVD is a well known technique for depositing various materials. It is well known to use PE-CVD in the production of semiconductor devices. In common with other methods of processing semiconductors, a very important factor in the realisation of a commercially useful process is the throughput of the system. A major problem which reduces the throughput is the clean process. The clean process is necessary to remove deposited material from the internal surfaces of the PE-CVD process chamber. Reductions in the time taken to perform a clean process or the time between clean processes will result in a higher throughput and a lower cost of ownership (COO). Modern clean processes have cleaning rates which are homogenous over the entire surfaces of the chamber. However, at least some PE-CVD processes result in depositions on the internal surfaces of the chamber which have an uneven distribution of deposition thicknesses. The deposition of silicon nitride, particularly at low deposition temperatures, provides an example of a PE-CVD process which produces a highly uneven thickness distribution of deposited material.

PE-CVD is commonly used to process silicon wafers. The typical PE-CVD single wafer chamber system design methodology is to limit the conduction of gas in the system. This is done with the intention of making the net pumping flow of the system across the wafer radial in direction. The intention is to provide uniform deposition across the wafer. Most commercial single wafer PE-CVD systems use ceramic spacers to tune the earth plane of the system, influence the shape of the plasma, and to achieve this radial conductance of gas. FIG. 1 shows an example of a prior art PE-CVD chamber, depicted generally at 10, comprising a chamber 12 having a platen 14 disposed therein. A "showerhead" 16, located at the top of the chamber 12, is used to introduce gases into the chamber 12. A plasma is formed using a plasma production device (not shown) as is well known in the art. The system 10 further comprises a lower ceramic spacer 18 and an upper ceramic spacer 20. The upper ceramic spacer 20 and the platen 14 define a relatively small first gap 22. The upper ceramic 20 and the lower ceramic 18 define a relatively small second gap 24 which leads to a circumferential pumping chamber 26. The circumferential pumping chamber 26 is in gas conducting communication with a pumping port. The pumping port is not shown in FIG. 1, but FIG. 2 does show the pumping port 28 and wafer entry slot 29. FIG. 2 is described in more detail below. The pumping port is connected to an exhaust line including a suitable pump in order to exhaust gas from the chamber to maintain a desired pressure within the chamber. Therefore, gases are exhausted from the chamber over a flow path which comprises the first pumping gap 22, the second pumping gap 24 and the circumferential pumping chamber 26. The first and second pumping gaps 22, 24 are relatively small in order to reduce the gas conductance of the system so as to produce a radial flow.

SUMMARY

The present invention, in at least some of its embodiments, addresses the above described problems. In particular, the present invention, in at least some of its embodiments, reduces the clean time associated with PE-CVD processes. This in turn can give rise to improved throughput and lower COO.

According to a first aspect of the invention there is provided a plasma enhanced chemical vapour deposition (PE-CVD) apparatus comprising:

a chamber comprising a circumferential pumping channel;

a substrate support disposed within the chamber;

one or more gas inlets for introducing gas into the chamber;

a plasma production device for producing a plasma in the chamber; and an upper and a lower element positioned in the chamber; wherein:

the upper element is spaced apart from the substrate support to confine the plasma and to define a first circumferential pumping gap, and the upper element acts as a radially inward wall of the circumferential pumping channel; and the upper and lower elements are radially spaced apart to define a second circumferential pumping gap which acts as an entrance to the circumferential pumping channel, in which the second circumferential pumping gap is wider than the first circumferential pumping gap.

The lower element may be radially spaced apart from the substrate support to define an auxiliary circumferential pumping channel disposed below the circumferential pumping channel and radially overlapping therewith. The first circumferential pumping gap may act as an entrance to the auxiliary circumferential pumping channel. The second circumferential pumping gap may act as an exit of the auxiliary circumferential pumping channel.

The lower element may comprise a base portion and a wall upstanding from the base portion. The lower element may be generally L shaped in cross section.

The lower element may be a liner which abuts a portion of an inner wall of the chamber. The inner wall of the chamber may comprise a step on which the liner is positioned.

The upper element may comprise a wall which depends downwardly into the chamber. The wall of the upper element may comprise an upper portion and a lower portion. The upper portion may be thicker than the lower portion.

The wall of the lower element may have a radially inward face. The wall of the upper element may have a radially outward face. The radially inward face of the wall of the lower element and the radially outward face of the wall of the upper element may be radially spaced apart to define the second circumferential pumping gap.

The wall of the upper element may act as the radially inward wall of the circumferential pumping channel.

The upper and lower elements may each be formed from a dielectric material. The upper and lower elements may each be formed form a ceramic material.

The upper and lower elements may be annular. Typically, the upper and lower elements are each provided as one piece arrangements. However, it is in principle possible to provide one or both of the upper and lower elements in more than one piece. Although it is preferred that each of the upper and lower elements are positioned in the chamber as unitary structures, it is in principle possible for one or both of the upper and lower elements to be multi-piece arrangements which are positioned in the chamber as a plurality of discrete, spaced apart structures.

The substrate support may have an upper surface which defines a level when the substrate support is in its in-use position. At least a portion of the circumferential pumping channel may be situated above said level.

The second circumferential pumping gap may be at least twice as wide as the second circumferential pumping gap.

The gas inlets may be provided in any suitable form, such as a showerhead. Many other arrangements would readily suggest themselves to the skilled reader.

The plasma production device may be of any suitable kind, such as is well known to the skilled reader. An example of a suitable device is a capacitively coupled plasma production device.

According to a second aspect of the invention there is provided a method of PE-CVD to process a substrate comprising the steps of:

providing an apparatus according to the first aspect of the invention;

positioning the substrate on the substrate support; and processing the substrate by performing PE-CVD, wherein gas is introduced into the chamber through the one or more gas inlets and gas is removed from the chamber via a flow path which comprises the first and second circumferential pumping gaps and the circumferential pumping channel.

Gas may be introduced into the chamber at a flow rate of greater than 3000 sccm, preferably greater than 5000 sccm, most preferably greater than 7000 sccm.

The PE-CVD may be performed to deposit silicon nitride onto the substrate.

Alternatively, the PE-CVD may be performed to deposit a silicon dioxide, silicon oxynitride or amorphous silicon onto the substrate.

It has been noted that the higher gas conductancies provided by the invention can give rise to a reduced pressure differential between the chamber and the circumferential pumping channel. During the PE-CVD processing, the pressure in the circumferential pumping channel may be within 5%, preferably within 4%, of the pressure in the chamber.

The substrate may be a semiconductor substrate. The substrate may be a silicon substrate. Typically, the silicon substrate is a silicon wafer.

Whilst the invention has been described above, it extends to any inventive combination of the features set out above, or within the following description, drawings or claims. For example, any feature described in relation to the first aspect of the invention is considered to be disclosed also in relation to the second aspect of the invention and vice versa.

BRIEF DESCRIPTION OF THE DRAWINGS

Embodiments of apparatus and methods in accordance with the invention will now be described with reference to the accompanying drawings, in which:—

DETAIL DESCRIPTION OF EMBODIMENTS

Figure 3:
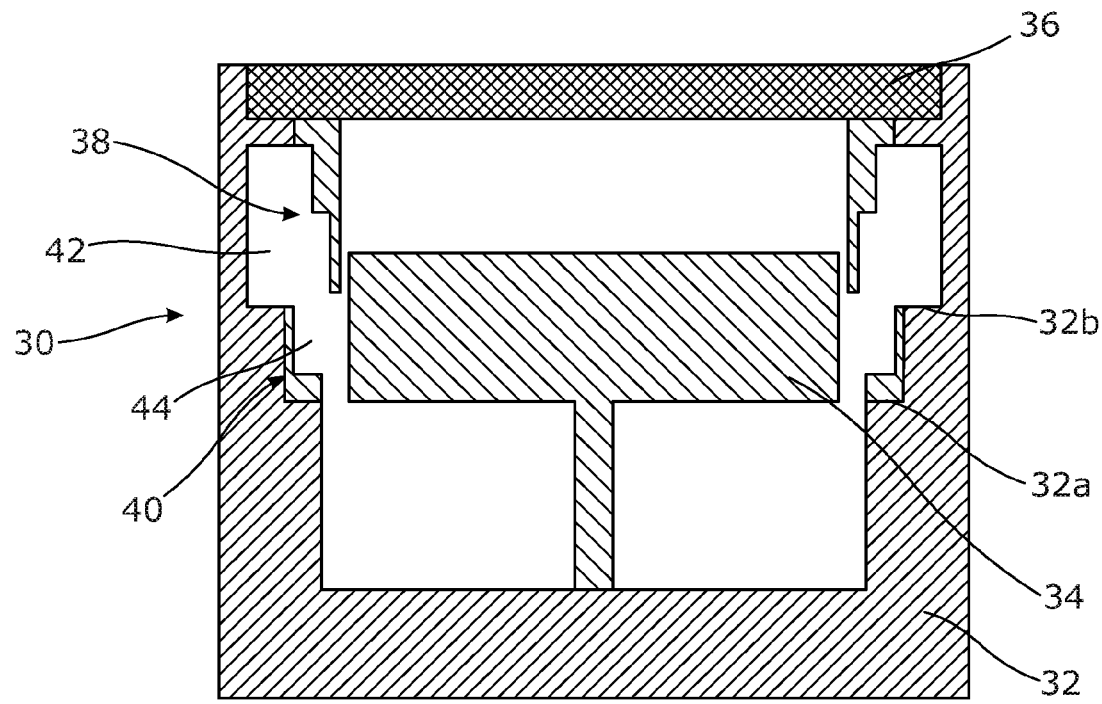
FIG. 3 is a cross sectional view of a PE-CVD apparatus of the invention.

FIG. 3 shows a PE-CVD apparatus, depicted generally at 30, comprising a chamber 32 having a substrate support 34 positioned therein. The substrate support 34 may be a platen on which a semiconductor wafer can be positioned. Typically, the platen can be moved between a lowered position for receiving the wafer and a raised, in-use, position for processing the wafer by PE-CVD. FIG. 3 shows the platen 34 in the raised, in-use, position. The apparatus 30 further comprises a showerhead 36 positioned at the top of the chamber 32. The showerhead 36 comprises a plurality of gas inlets which allows a desired gas or gaseous mixture to be introduced into the chamber 32 from a gas supply system (not shown). Typically, a gaseous mixture is supplied to the chamber 32 which comprises one or more process gases in combination with one or more carrier gases. A plasma is created in the main chamber 32 using a plasma production device (not shown). This leads to deposition of material on the semiconductor wafer by a desired process. PE-CVD processes and associated plasma production devices are well known to the skilled reader. In one embodiment, the apparatus 30 shown in FIG. 3 can be implemented using a capacitively coupled plasma production device. The apparatus 30 further comprises an upper element 38 and a lower element 40. The upper and lower elements 38, 40 are each in the form of a ceramic spacer.

The chamber 32 comprises first and second step sections 32(a), 32(b). The first step section 32(a) receives the lower element 40, which is an annular ring structure having an L shape cross section. The second step section 32(a) in combination with the upper element 38 defines a main circumferential pumping channel 42.

Figure 4:
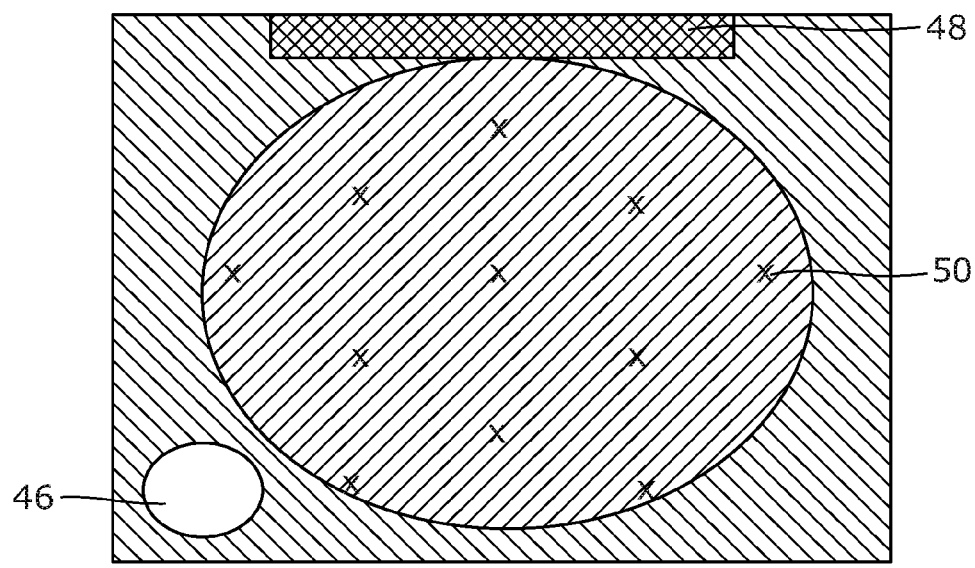
FIG. 4 shows silicon nitride deposition in the apparatus of FIG. 3.

The ceramic upper and lower elements 38, 40 can be used for one or more known purposes such as changing the earth plane of the apparatus, influencing the shape of the plasma, and protecting the apparatus from the plasma. In particular, the upper element 38 is of annular form and is positioned to surround the wafer and the uppermost part of the substrate support 34. This acts to confine the plasma. The lower element 40 acts to protect the walls of the chamber 32 from the plasma. Additionally, the upper and lower elements 38, 40 define part of the flow path which gases flow along as they are exhausted from the chamber 32. The upper element 38 is spaced apart from the substrate support 34 to define a first pumping gap. Gases flowing through the first pumping gap then enter a region 44 which can be described as an auxiliary pumping channel. The auxiliary pumping channel is defined by the lower element 40 and the side region of the wafer support 34. The uppermost portion of the lower element 38 and the lowermost portion of the upper element 40 define a second pumping channel which leads to the main circumferential pumping channel 42. The main circumferential pumping chamber 42 is in gas conducting communication with a pumping port 46. The pumping port 46 is shown in FIG. 4, which also shows a wafer entry port 48. The pumping port 46 is connected to a vacuum line (not shown) which includes a suitable pump. The vacuum line can be of essentially conventional construction.

Figure 1:
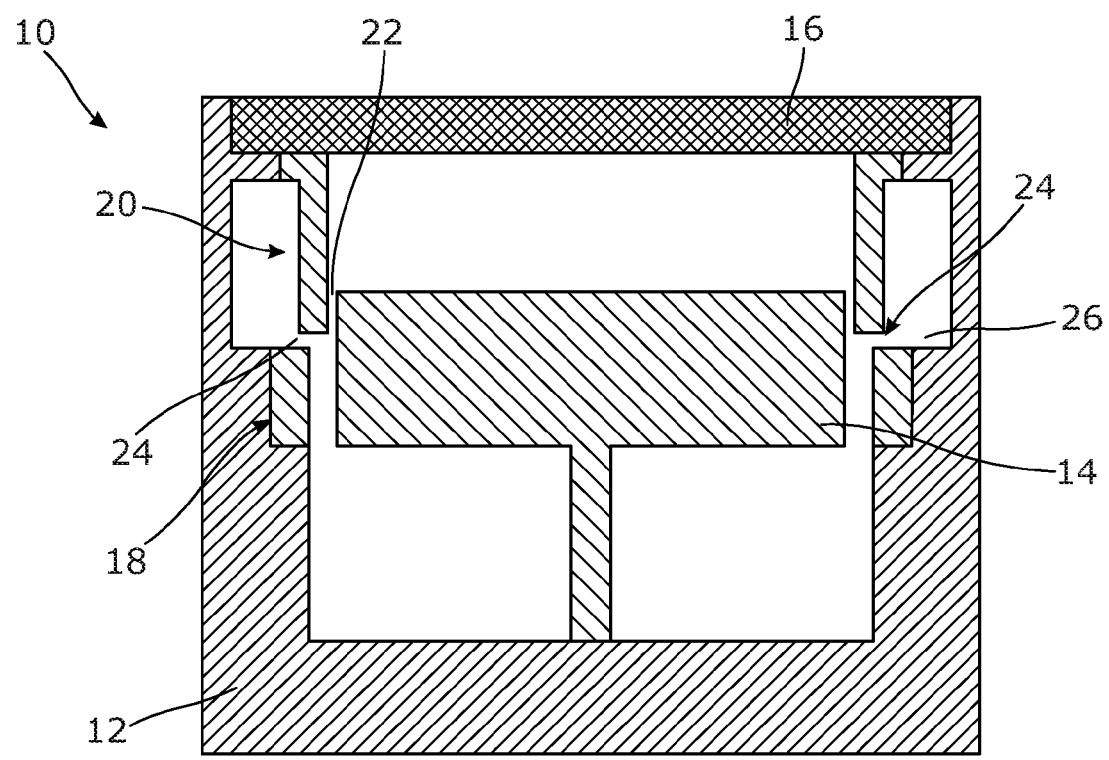
FIG. 1 is a cross sectional view of a prior art PE-CVD apparatus.
Figure 2:
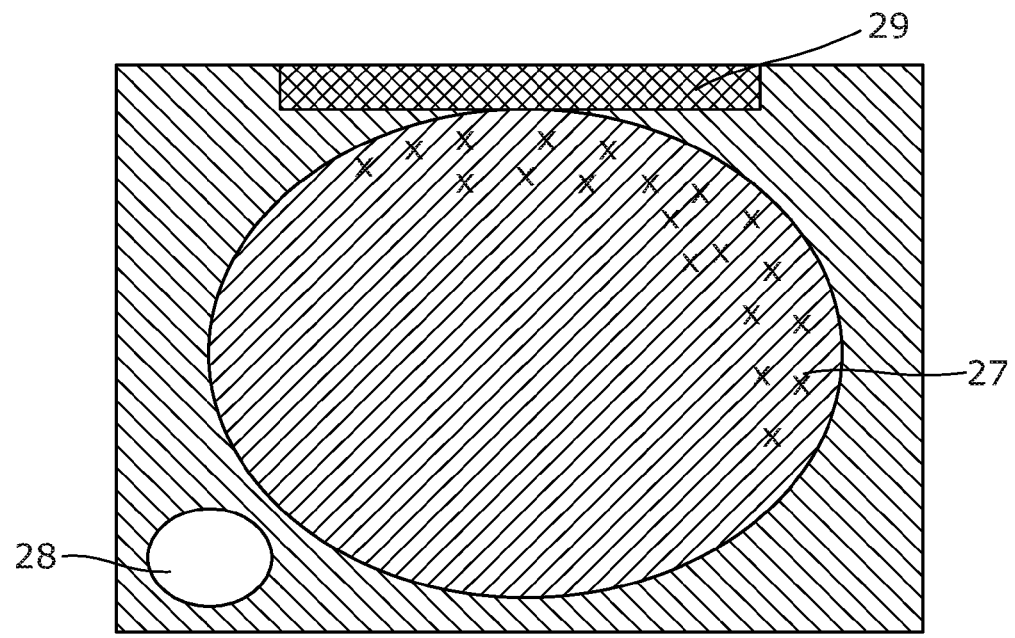
FIG. 2 shows silicon nitride deposition in the apparatus of FIG. 1.

Experiments were performed using the prior art apparatus of FIG. 1 and the apparatus of the invention shown in FIG. 3. Silicon nitride was deposited in both chambers. FIG. 2 shows that silicon nitride is deposited in an area 27 denoted by the symbol X using the prior art apparatus. FIG. 4 shows that silicon nitride was deposited at locations 50 denoted by the symbol X using the apparatus of the invention. It can be seen that the prior art apparatus gives rise to a highly asymmetrical deposition of silicon nitride. In contrast, with the apparatus of FIG. 3, the deposition of silicon nitride is spread far more evenly throughout the chamber. This is the consequence that the thickness of the silicon nitride deposition on the chamber of the invention is reduced. In comparison, the prior art apparatus gives rise to areas of a relatively high thickness of deposited silicon nitride. A consequence of the thicker deposition obtained with the prior art apparatus is that it requires a longer clean time to remove the deposited material. Experiments were performed running a low temperature "via reveal" application to produce a SiN/SiN/SiO stack. It was found that in comparison to the prior art apparatus, the apparatus of the invention gives rise to a reduction in clean time from 720 to 130 seconds. This will give rise to a consequent and substantial improvement in throughput. It is also noted that a further consequence of the asymmetric deposition pattern shown in FIG. 2 is that areas having a thinner deposition layer will be over cleaned.

Experiments were also performed to investigate the effect of the present invention on the film properties and process parameters for PE-CVD deposition of silicon nitride and silicon oxide using a range of process recipes. The experiments were performed using a number of 300 mm diameter silicon wafer substrates. Table 1 shows important dielectric film properties. It can be seen that the properties of the films obtained using the invention compare highly favourably with the equivalent films obtained using the prior art apparatus. In fact, the measured properties obtained using the prior art apparatus and the apparatus of the invention agree to within the relevant error bands for the measurements. Also, it has been found that the end point signal (an optical measurement of excited free radical fluorine species in the plasma) and DC bias signal profiles are very similar using identical $NF_3$ clean recipe with both kinds of apparatus. Additionally, the apparatus of the invention has been found to have no effect on the electrical and optical characteristics of $C_3F_8/O_2$ cleans as well.

the flow path and/or volume of the auxiliary circumferential pumping chamber 44 plays a role. It is noted that the absolute pressure in the main chamber of both the prior art apparatus and the apparatus of the invention during the PE-CVD process was the same, even though the gas conductance is higher with the present invention. This was achieved by controlling a throttle valve on the exhaust line.

TABLE 2

The difference between chamber pressure (controlled by throttle valve) and pumping channel pressure for four different dielectric recipes.

| Process | Chamber Pressure/ mT | Pumping Channel Pressure (Prior Art)/ mT | Pumping Channel Pressure (Invention)/ mT |
|---|---|---|---|
| Compressive SiN1 | 2100 | 1925 | 2040 |
| Compressive SiN2 | 1999 | 1815 | 1940 |
| Tensile SiN | 1999 | 1865 | 1945 |
| TEOS SiO | 3099 | 2940 | 3005 |

Figure 5:
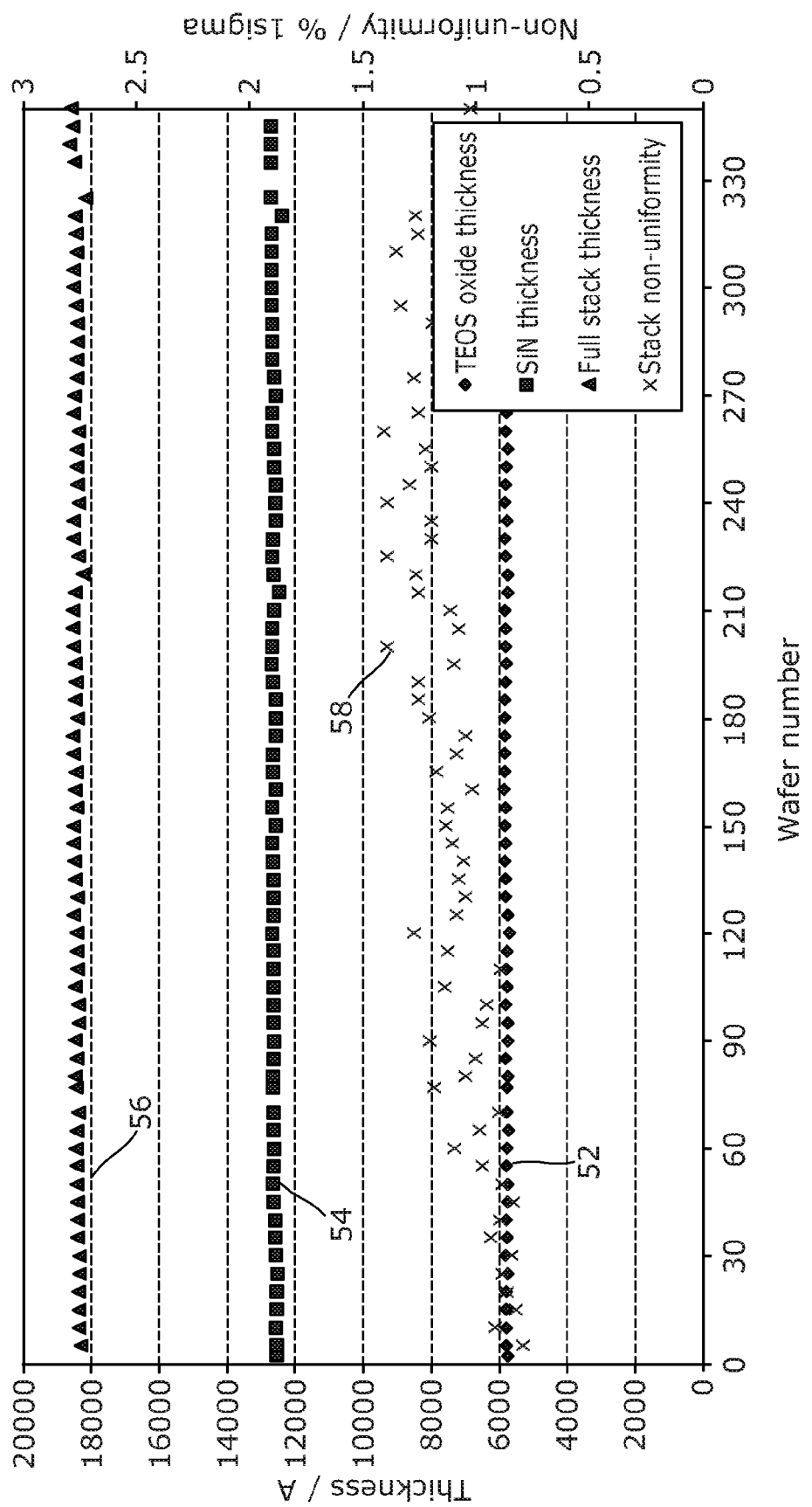
FIG. 5 is a graph of deposition thickness and thickness non-uniformity against number of wafers processed.

FIG. 5 shows wafer to wafer film thicknesses for a typical via reveal SiN/$SiO_2$ stack obtained using the apparatus of FIG. 3. Cleans were performed between the processing of consecutive wafers. In FIG. 5, the diamond symbols 52 relate to the $SiO_2$ film, the square symbols 54 relate to silicon nitride deposited film, and the triangle symbols 56 relate to the thickness of the overall stack. FIG. 5 also shows the non-uniformity of the overall stack. The X symbols 58 refer to stack non-uniformity data. It could be seen that the apparatus of the present invention gives rise to excellent film properties.

TABLE 1

Comparison of essential dielectric test film properties with prior art apparatus and apparatus of the invention.

| Process | Apparatus | Dep. Rate/ nm·$min^{-1}$ | Non-uniformity/ % range·$2mean^{-1}$ | RI | Stress/ Mpa | Leakage@ 2 MV·$cm^{-1}$ | Breakdown/ MV·$cm^{-1}$ |
|---|---|---|---|---|---|---|---|
| Compressive SiN1 | Prior Art | 369 | 3.9 | 1.9234 | −329 | 2E−10 | 10 |
| | Invention | 376 | 3.9 | 1.9352 | −349 | 5E−10 | 11 |
| Compressive SiN2 | Prior Art | 329 | 4.2 | 1.9575 | −30 | 6E−10 | 9 |
| | Invention | 329 | 4.5 | 1.9552 | −33 | 7E−10 | 10 |
| Tensile SiN | Prior Art | 205 | 4.1 | 1.8984 | 227 | 5E−10 | 11 |
| | Invention | 203 | 4.1 | 1.8993 | 229 | 2E−10 | 11 |
| TEOS SiO | Prior Art | 637 | 3.5 | 1.4525 | 17 | 3E−10 | 12 |
| | Invention | 635 | 2.1 | 1.4515 | 15 | 5E−10 | 13 |

Table 2 shows the measured pressures in the main chamber and the circumferential pumping chamber of the prior art apparatus of FIG. 1 and the apparatus of the invention of FIG. 3. It can be seen that the prior art apparatus gives rise to a significant pressure differential between the main chamber and the circumferential pumping chamber. This is easily rationalised in terms of the restricted pumping gaps 22, 24 which lead to the circumferential pumping channel 26. As explained above, this is a deliberate design feature intended to reduce gas conduction in order to achieve a radial flow across the wafer. In contrast, the present invention provides a much reduced pressure differential between the chamber and the circumferential pumping channel. It is not presently confirmed whether the flow across the wafer is radial or not. Without wishing to be limited by any particular theory or conjecture, it is believed that it can be rationalised in terms of the larger second pumping gap defined by the spaced apart upper and lower elements 38, 40. It is also possible that It is believed that the present invention provides particularly good results when using in conjunction with PE-CVD processes having high gas flow rates. However, the invention is not limited to high flow rate processes. The advantageous effects provided by the invention are not thought to be limited to the precise process recipe used. To the contrary, the invention is believed to be applicable to a wide range of deposition recipes to provide a wide range of deposited materials such as silicon oxide, silicon oxynitride and amorphous silicon.

What is claimed is:
1. A method of performing plasma-enhanced chemical vapor deposition (PE-CVD) comprising the steps of:
providing an apparatus including a process chamber,
a substrate support disposed within the process chamber,
one or more gas inlets communicating with the process chamber, and an upper and a lower element disposed in the process chamber, wherein a radially inner surface of the upper element and a side of the substrate support face and are spaced from one another by a first distance in a radial direction of the process chamber to define a first circumferential pumping gap therebetween, the upper element has a radially outwardly facing surface delimiting a radially inner side of a main circumferential pumping channel of the process chamber, the lower element faces and is spaced from the side of the substrate support in the radial direction of the chamber to delimit therewith an auxiliary circumferential pumping channel of the process chamber disposed below the main circumferential pumping channel as radially overlapped therewith, the first circumferential pumping gap constituting an entrance to the auxiliary circumferential pumping channel, a bottommost part of the upper element and an uppermost part of the lower elements are offset from each other by a second distance in the radial direction to define a second circumferential pumping gap which opens into the main circumferential pumping channel thereby constituting both an entrance to the main circumferential pumping channel and an exit of the auxiliary circumferential pumping channel, and the second distance is greater than the first distance;

positioning a substrate on the substrate support;

processing the substrate by introducing gas into a process region of the process chamber, disposed radially inwardly of the main circumferential pumping channel, through the one or more gas inlets, exciting the gas to form a plasma, depositing material on the substrate using the plasma, and removing gas in the process region of the process chamber from the apparatus through the auxiliary circumferential pumping channel via the entrance thereof constituted by the first circumferential pumping gap and subsequently through the main circumferential pumping channel directly via the second circumferential pumping gap that affords both the entrance to the main circumferential pumping channel and the exit of the auxiliary circumferential pumping channel, wherein the gas is removed via a flow path which includes the first circumferential pumping gap, the second circumferential pumping gap which is wider in the radial direction than the first circumferential pumping gap, and the main circumferential pumping channel which is disposed radially outwardly of the process region.

2. A method according to claim 1 in which gas is introduced into the process chamber at a flow rate of greater than 3000 sccm.

3. A method according to claim 1 in which the processing of the substrate comprises depositing silicon nitride onto the substrate.

4. A method according to claim 1 in which the processing of the substrate comprises depositing silicon dioxide, silicon oxynitride or amorphous silicon onto the substrate.

5. A method according to claim 1 in which, during the processing of the substrate, the pressure in the circumferential pumping channel is regulated to be within 5% of the pressure in the process chamber.

6. A method according to claim 1 in which a semiconductor substrate is positioned on the substrate support and is subjected to said processing.

7. A method according to claim 1 in which the upper and lower elements each are of dielectric material.

8. A method according to claim 1 in which the upper and lower elements each are of ceramic material.

9. A method according to claim 1 in which the upper and lower elements are annular, wherein the removing of gas from the apparatus comprises removing the gas through a first annular opening constituted by the first circumferential pumping gap and subsequently through the entrance to the main circumferential pumping channel constituted by the second circumferential gap, the entrance having the form of an annular opening whose radial width is greater than that of the first annular opening.

10. A method according to claim 1 further comprising providing an upper surface of the substrate support at a level below that of a portion of the main circumferential pumping channel during the processing of the substrate.

11. A method according to claim 1 in which gas is introduced into the processing region of the process chamber at a flow rate of greater than 5000 sccm.

12. A method according to claim 1 in which gas is introduced into the processing region of the process chamber at a flow rate of greater than 7000 sccm.

13. A method according to claim 1 in which, during the processing of the substrate, the pressure in the main circumferential pumping channel is regulated to be within 4% of the pressure in the processing region of the process chamber.

* * * * *